United States Patent
Raieszadeh et al.

(10) Patent No.: US 9,742,373 B2
(45) Date of Patent: Aug. 22, 2017

(54) METHOD OF MANUFACTURING A TEMPERATURE-COMPENSATED MICROMECHANICAL RESONATOR

(71) Applicant: The Regents of The University of Michigan, Ann Arbor, MI (US)

(72) Inventors: Mina Raieszadeh, Ann Arbor, MI (US); Zhengzheng Wu, Ann Arbor, MI (US); Vikram Atul Thakar, Ann Arbor, MI (US); Adam Peczalski, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 623 days.

(21) Appl. No.: 13/665,781

(22) Filed: Oct. 31, 2012

(65) Prior Publication Data
US 2013/0106246 A1    May 2, 2013

Related U.S. Application Data

(60) Provisional application No. 61/553,907, filed on Oct. 31, 2011.

(51) Int. Cl.
*H03H 3/02*        (2006.01)
*H01L 41/22*       (2013.01)
(Continued)

(52) U.S. Cl.
CPC .............. *H03H 3/02* (2013.01); *H01L 21/00* (2013.01); *H01L 23/34* (2013.01); *H01L 41/22* (2013.01);
(Continued)

(58) Field of Classification Search
CPC .. H03H 3/03; H03H 3/0076; H03H 2003/021; H03H 2003/023;
(Continued)

(56) References Cited

U.S. PATENT DOCUMENTS 3,656,354 A    4/1972 Lynch
3,719,074 A    3/1973 Lynch
(Continued)

FOREIGN PATENT DOCUMENTS

JP    2007110281 A  *  4/2007

OTHER PUBLICATIONS

J.R. Reid et al., "A Micromachined Vibration Isolation System for Reducing the Vibration Sensitivity of Surface Transverse Wave Resonators," IEEE Trans. Ultrason. Ferroelectr. Freq. Control, 45, pp. 528-534, 1998.
(Continued)

*Primary Examiner* — A. Dexter Tugbang
(74) *Attorney, Agent, or Firm* — Reising Ethington P.C.

(57) ABSTRACT

A method of making a temperature-compensated resonator is presented. The method comprises the steps of: (a) providing a substrate including a device layer; (b) replacing material from the device layer with material having an opposite temperature coefficient of elasticity (TCE) along a pre-determined region of high strain energy density for the resonator; (c) depositing a capping layer over the replacement material; and (d) etch-releasing the resonator from the substrate. The resonator may be a part of a micro electromechanical system (MEMS).

19 Claims, 7 Drawing Sheets

(51) Int. Cl.
   H01L 23/24    (2006.01)
   H01L 23/34    (2006.01)
   H01L 21/00    (2006.01)
   H01L 41/29    (2013.01)
   H03H 3/007    (2006.01)
   H03H 9/02     (2006.01)
   H03H 9/24     (2006.01)

(52) U.S. Cl.
   CPC ........... *H01L 41/29* (2013.01); *H03H 3/0076* (2013.01); *H03H 9/02448* (2013.01); *H01L 2924/0002* (2013.01); *H03H 2003/021* (2013.01); *H03H 2003/023* (2013.01); *H03H 2009/02496* (2013.01); *H03H 2009/02503* (2013.01); *H03H 2009/2421* (2013.01); *Y10T 29/42* (2015.01); *Y10T 29/49005* (2015.01); *Y10T 29/4913* (2015.01)

(58) Field of Classification Search
   CPC ..... H03H 9/02448; H03H 2009/02496; H03H 2009/02503; H03H 2009/2421; H03H 3/02; H01L 21/00; H01L 23/34; H01L 2924/0002; H01L 41/22; H01L 41/29; H01L 2924/00; Y10T 29/42; Y10T 29/49005; Y10T 29/4913
   See application file for complete search history.

(56) References Cited

U.S. PATENT DOCUMENTS

| | | | |
|---|---|---|---|
| 3,992,952 | A | 11/1976 | Hutton et al. |
| 4,125,017 | A | 11/1978 | Dhuyvetter et al. |
| 4,793,195 | A | 12/1988 | Koning |
| 4,951,508 | A | 8/1990 | Loper, Jr. et al. |
| 5,061,863 | A * | 10/1991 | Mori ............... H01L 2924/0002 327/362 |
| 5,479,161 | A | 12/1995 | Keyes et al. |
| 5,763,780 | A | 6/1998 | Matthews et al. |
| 5,801,310 | A | 9/1998 | Matthews et al. |
| 5,983,719 | A | 11/1999 | Matthews et al. |
| 6,189,382 | B1 | 2/2001 | Johnson |
| 6,355,498 | B1 * | 3/2002 | Chan et al. ............. H03H 3/02 |
| 6,725,719 | B2 | 4/2004 | Cardarelli |
| 7,296,468 | B2 | 11/2007 | Varty et al. |
| 7,581,443 | B2 | 9/2009 | Kubena et al. |
| 7,889,030 | B2 | 2/2011 | Schoen et al. |
| 2008/0224319 | A1 * | 9/2008 | Nakamura ....... H03H 2009/024 |
| 2008/0296999 | A1 * | 12/2008 | Kido ...................... Y10T 29/42 310/313 B |
| 2009/0160581 | A1 | 6/2009 | Hagelin et al. |

OTHER PUBLICATIONS

J. Rutman et al., "Characterization of Frequency Stability in Precision Frequency Sources," Proceedings of the IEEE, vol. 79, No. 7, pp. 952-960, Jul. 1991.
J.C. Salvia et. al., "Real-Time Temperature Compensation of MEMS Oscillators Using an Integrated Micro-Oven and a Phase-Locked Loop," Journal of Microelectromechanical Systems, vol. 19, No. 1, pp. 192-201, Feb. 2010.
A.R. Schofield et al., "Multi-Degree of Freedom Tuning Fork Gyroscope Demonstrating Shock Rejection," Proc. IEEE Sensors pp. 120-123, 2007.
A. Selvakumar et al., "A High Sensitivity Z-Axis Capacitive Silicon Microaccelerometer With a Torsional Suspension," IEEE/ASME Journal of Microelectromechanical Systems, vol. 7, No. 2, Jun. 1998.
A. Selvakumar et al., "A Wide-Range Micromachined Threshold Accelerometer Array and Interface Circuit," Journal of Micromechanics and Microengineering, vol. 11, 2001, pp. 118-125.
A. Sharma et. al., A 0.1/HR Bias Drift Electronically Matched Tuning Fork Microgyroscope, Proceedings of the IEEE MEMS Conference, pp. 6-9, 2008.
B. Shiari et al., "Multiscale Modeling of Ductile Crystal at the Nanoscale Subjected to Cyclic Indentation," Acta Materials, vol. 56 (12), pp. 2799-2809, 2008.
B. Shiari et al., "Multiscale Simulation of Material Removal Process at Nanoscale," Journal of the Mechanics and 35 Physics of Solids, vol. 55, pp. 2384-2405, 2007.
B. Shiari et al., "Coupled Atomistic/Discrete Dislocation Simulations of Nanoindentation at Finite Temperature," ASME J. of Engineering Materials and Technology, vol. 127, pp. 358-368, 2005.
S. Sung et al., "A Vibration_Controlled Resonant Accelerometer Design and its Application to the Single Structured Gyroscope-Accelerometer System," Proc. 2007 IEEE Int. Conference on Vehicular Electronics and Safety, 2008.
C.W. Tan et al., "Design of Accelerometer-Based Inertial Navigation Systems," IEEE Transactions on Instrumentation and Measurement, v 54, n 6, p. 2520-2530, Dec. 2005.
J. Vig, "Introduction to Quartz Frequency Standards", available at IEEE-UFFC website at http://www.ieeeuffc.org/frequency_control/teaching.asp?name=vigtoc.
J. W. Weigold et al., "Design and Fabrication of Submicrometer, Single Crystal Si Accelerometer," IEEE/ASME Journal of Microelectromechanical Systems, vol. 10, No. 4, pp. 518-524, Dec. 2001.
Weinburg et. al. , "Error Sources in In-Plane Silicon Tuning-Fork MEMS Gyroscope", IEEE Journal of Microelectromechanical Systems, v.15, n.3, p. 479-91, Jun. 2006.
P. Willems et al., "Investigations of the Dynamics and Mechanical Dissipation of a Fused Silica Suspension," Physics Letters A 297, 2002, pp. 37-48.
N. Yazdi et al., "An All-Silicon Single-Wafer Micro-g Accelerometer with a Combined Surface and Bulk Micromachining Process," IEEE/ASME Journal of Microelectromechanical Systems, vol. 9, No. 4, Dec. 2000, pp. 1-8.
N. Yazdi et al., "A Generic Interface Chip for Capacitive Sensors in Low-Power Multi-Parameter Microsystems," Sensors & Actuators, A: Physical, 84 (3) pp. 351-336, 2000.
C. Yeh et al., "A Low-Voltage Tunneling Based Silicon Microaccelerometer," IEEE Transactions on Electron Devices, vol. 44, No. 11, pp. 1875-1882, Nov. 1997.
C. Yeh et al., "CMOS Interface Circuitry for a Low-Voltage Micromachined Tunneling Accelerometer," IEEE/ASME J. Micro Electro Mechanical Systems (JMEMS), Mar. 1998.
S. Yoneoka et. al., "Acceleration Compensation of MEMS Resonators Using Electrostatic Tuning," IEEE MEMS Conference, Jan. 2009.
S.W.Yoon et. al., "Novel Integrated Shock Protection for MEMS", Proceedings of Transducers 2005 Seoul, 2005.
S.W. Yoon et al., Micromachined Integrated Shock Protection for MEMS, Sensors and Actuators A: Physical, 130-131, pp. 166-175, 2006.
S.W. Yoon et al., "Shock Protection using Integrated Nonlinear Spring Shock Stops," Technical Digest of IEEE Int. Conf. on Micro Electro Mechanical Systems (MEMS 2006), Istanbul, Turkey, pp. 702-705, 2006.
S.W. Yoon et al., "Vibration Sensitivity of MEMS Tuning Fork Gyroscopes," Proc. IEEESensors Conf. (Atlanta, GA, USA) pp. 115-119, 2007.
S.W. Yoon, "Vibration Isolation and Shock Protection for MEMS," PhD Dissertation University of MI, 2009, pp. 1-209.
S.W. Yoon et al., "Analysis and Wafer-Level Design of a High-Order Silicon Vibration Isolator for Resonating MEMS Devices." J. Micromech. Microeng., v. 21, 11, pp. 1-11, 2011.
A. Agreev et. al., "Very High Quality Factor Measured in Annealed Fused Silica", Classical and Quantum Gravity, v. 21, n. 16, pp. 3887-3892, 2004.
D. Anderson et al., "Quantitative Understanding of the Fly Casting Stroke Through Measurements and Robotic Casting," Journal Sports Engineering, 9:97-106, 2006.
F. Ayazi et al., "A HARPSS polysilicon Vibrating Ring Gyroscope," J. Micro Electro Mechanical Systems, v. 10, n. 2, p. 169-179, Jun. 2001.

(56) References Cited

OTHER PUBLICATIONS

F. Ayazi et al., "Design and Fabrication of a High-Performance Polysilicon Vibrating Ring Gyroscope," Proc. 1998 IEEE/ASME Micro Electra Mechanical Systems Workshop, Heidelberg, Germany, p. 621, 1998.

F. Ayazi et al. "High Aspect-Ratio Combined Poly and Single-Crystal Silicon (HARPSS) MEMS Technology," Journal of Microelectromechanical Systems, vol. 9, No. 3, Sep. 2000.

I.A. Bilenko et al., "Mechanical Losses in Thin Fused Silica Fibres", Classical and Quantum Gravity, v 21, n 5, p. S1231-5, 2004.

D.S. Bindel et al., "Elastic PMLs for Resonator Anchor Loss Simulation," Int. J. Numer. Meth. Engrg., vol. 64, pp. 789-818, 2005.

T. Braman et al., "Designing Vibration and Shock Isolation Systems for Micro Electrical Machined Based Inertial Measurement Units," Proc. IEEE/ION Position, (PLANS), pp. 400-404.

E. Cesarini et. al., "Mechanical Characterization of 'Uncoated' and 'Ta2O5-Single-Layer-Coated' SiO2 Substrates: Results from GeNS Suspension, and the CoaCh project", Classical and Quantum Gravity, 35 v. 27, n. 8, Apr. 2010. pp. 1-10.

H.L.Chao et. al., Tensile Fracture Strength of ST Cut Quartz, Proceedings of the 37th Annual Frequency Control Symposium 1983, p. 116-24, 1983.

J. Chae et al., "An In-Plane High-Sensitivity, Low-40 Noise Micro-g Silicon Accelerometer with CMOS Readout Circuitry," IEEE/ASME Journal of Microelectromechanical Systems (JMEMS), vol. 13, No. 4, p. 628-635, Aug. 2004.

J. Chae, H. Kulah, and K. Najafi, "A CMOS-Compatible High Aspect Ratio Silicon-on-Glass in-Plane Micro-accelerometer," J. Micromechanics and Microengineering, 15, No. 2, pp. 336-345, Feb. 2005.

J. Chae et al.,"A Monolithic Three-Axis Micro-g Micromachined Silicon Capacitive Accelerometer," IEEE Journal of Microelectromechanical Systems (JMEMS), vol. 14, No. 2, pp. 235-242, Apr. 2005.

HPFS fused silica property sheet, available at www.corning.com/docs/specialtymaterials/pisheets/H0607_hpfs_Standard_ProductSheet.pdf.

M.J. Dalal et. al., "Simultaneous Dual-mode Excitation of Piezo-on-Silicon Micromechanical Oscillator for Self-temperature Sensing," IEEE MEMS Conference, Jan. 2011.

R. Dean et al., "Micromachined Vibration Isolation Filters to Enhance Packaging for Mechanically Harsh Environments," J. Microelectron. Electron.Packag. 2 223-31.

A. Duwel et. al., "Engineering MEMS Resonators with Low Thermoelastic Damping," Journal of Microelectromechanical Systems, vol. 15, pp. 1437-1445, 2006.

K. Egashira et al., "Microultrasonic Machining by the Application of Workpiece Vibration," CIRP Annals-Manufacturing Technology, vol. 48, pp. 131-134, 1999.

E.J. Eklund et al., "Glass Blowing on a Wafer Level," Journal of Microelectromechanical Systems, v. 16, n. 2, p. 232-9, Apr. 2007.

R.L. Filler, "The Acceleration Sensitivity of Quartz Crystal Oscillators: A Review," IEEE Transactions on Ultrasonics, Ferroelectrics, and Frequency Control, May 1988.

F. Frost et al., "Large Area Smoothing of Surfaces by Ion Bombardment: Fundamentals and Applications," J Physics: Condensed Matter, v. 21, n. 22, p. 224026, 2009.

J. Geen et al., "Single-Chip Surface Micromachined Integrated Gyroscope with 500/h Allan Deviation," IEEE J. Solid-State Circuits, 37, pp. 1860-1866, 2002.

P. L. Guzzo et al., "A Comparative Study on Ultrasonic Machining of Hard and Brittle Materials," J. Braz. Soc. Mech. Sci. & Eng., vol. 26, No. 1, pp. 56-61, 2004.

A. Goyal et al., "Use of Singlewalled Carbon Nanotubes to Increase the Quality Factor of an AT-Cut Micromachined Quartz Resonator," Applied Physics Letters, v. 87, p. 204102, 2005.

S. Habibi et al, "Gun Hard Inertial Measurement Unit Based on MEMS Capacitive Accelerometer and Rate Sensor," IEEE PLAN Symp., May 2008.

M.L. Hammond et. al. "Influence of Environment on Brittle Fracture of Silica", Journal of the American Ceramic Society, vol. 46, No. 7, pp. 329-332, Jul. 1963.

Z. Hao et al., "An Analytical Model for Support Loss in Micromachined Beam Resonators with In-plane Flexural Vibrations," Sensors and Actuators A, vol. 109, Dec. 2003, pp. 156-164.

L. He et al. "A CMOS Readout Circuit for SOI Resonant Accelerometer With 4-ug Bias Stability and 20-sqrt(Hr) Resolution", IEEE Journal of Solid-State Circuits, vol. 43, No. 6, Jun. 2008.

S.-H. Lee et. al., "A Low-Power Oven-Controlled Vacuum Package Technology for High-Performance MEMS", Proceedings from MEMS 09 Sorrento, 2009.

A. Higo et al., "Novel Parylene/Al/Parylene Sandwich Protection Mask for Hf Vaporrelease for Micro Electro Mechanical Systems," Proc. Int. Solid-State Sensors, Actuators and Microsystems Conf. (Transducers), Denver 2009.

G. K. Ho et. al, "Temperature Compensated IBAR Reference Oscillators," MEMS 2006.

G.K. Ho et al., "Micromechanical IBARs: Modeling and Process Compensation," Journal of Microelectromechanical Systems, vol. 19, No. 3, pp. 516-525, Jun. 2010.

D.D. Lynch et al., "Innovative Mechanizations to Optimize Intertial Sensors for High or Low Rate Operations," Symposium Gyro Technology, Stuttgart, Germany, 1997.

B. Friedland "Theory and Error Analysis of Vibrating-Member Gyroscope," IEEE Transactions on Automatic Control, v. 23, n. 4, Aug. 1978.

Y. Zhbanov, "Amplitude Control Contour in a Hemispherical Resonator Gyro with Automatic Compensation for Difference in Q-factors," Mechanics of Solids, v. 43, n. 3, p. 328-332, 2008.

Northrop Grumman, "Scalable SIRU ,"http://www.es.northropgrumman.com/solutions/sirucore/assets/scalable_SIRU.pdf, retrieved May 28, 2010.

D.M. Rozelle, "The hemispherical resonator gyro: from wineglass to the planets," http://www.es.northropgrumman.com/media/whitepapers/assets/hrg.pdf, retrieved May 28, 2010.

Y-S Hwang et. al. , "Fabrication of Electrostatically-Actuated, In-Plane Fused Quartz Resonators using Silicon-on-Quartz (SOQ) Bonding and Quartz DRIE", MEMS 2009.

M. Hwango et al., "Factorization-Based Calibration Method for MEMS Inertial Measurement Unit", IEEE Int'l Conf on Robotics and Automation (ICRA), May 2008, pp. 1306-1311.

V. Kaajakari et al., "Phase Noise in Capacitively Coupled Micromechanical Oscillators," IEEE Transactions on Ultrasonics, Ferroelectrics and Frequency Control, vol. 52, No. 12, pp. 2322-2331, Dec. 2005.

R. N. Candler, et al, "Single Wafer Encapsulation of MEMS Devices," IEEE Trans. Adv. Packaging, v. 26, n. 3, Aug. 2003.

S. J. Kim et al., "Active Vibration Control and Isolation for Micromachined Devices," ASME J. Mech. Des. 131 pp. 091002-091006.

K.W. King et al., "Wireless MEMS Inertial Sensor System for Golf Swing Dynamics," Sensors and Actuators A: Physical, 141, 619-630, 2008.

H. Kulah et al., "Noise Analysis and Characterization of a Sigma-Delta Capacitive Microaccelerometer," IEEE Journal of Solid-State Circuits, v 41, n 2, p. 352-360, 2006.

B. Lee, et al., "A Dynamically Tuned Vibratory Micromechanical Gyroscope Accelerometer," Proceedings of the SPIE, v 3242, p. 86-95, 1997.

S. H. Lee et al., "A Generic Environment-Resistant Packaging Technology for MEMS," Proc. Int. Solid-State Sensors, Actuators and MicrosystemsConf. (Transducers) (Lyon, France) 25 pp. 335-338, 2007.

S-H Lee, "Wafer-Level Packaging for Environment-Resistant Microinstruments", PhD thesis, University of Michigan, 2008.

R. Lifshitz et al., "Thermoelastic Damping in Micro- and Nano-Mechanical Systems," Phys. Rev. B 61, 5600, 2000.

Y. Meyer et al. "Active Isolation of Electronic Micro-Components with Piezoelectrically Transduced Silicon MEMS Devices," SmartMater. Struct. 16, pp. 128-134, 2007.

(56) References Cited

OTHER PUBLICATIONS

G. Niu et. al., "Transistor Noise in SiGe HBT RF Technology," IEEE Journal of Solid-State Circuits, vol. 36, No. 9, pp. 1424-1427, Sep. 2001.

\* cited by examiner

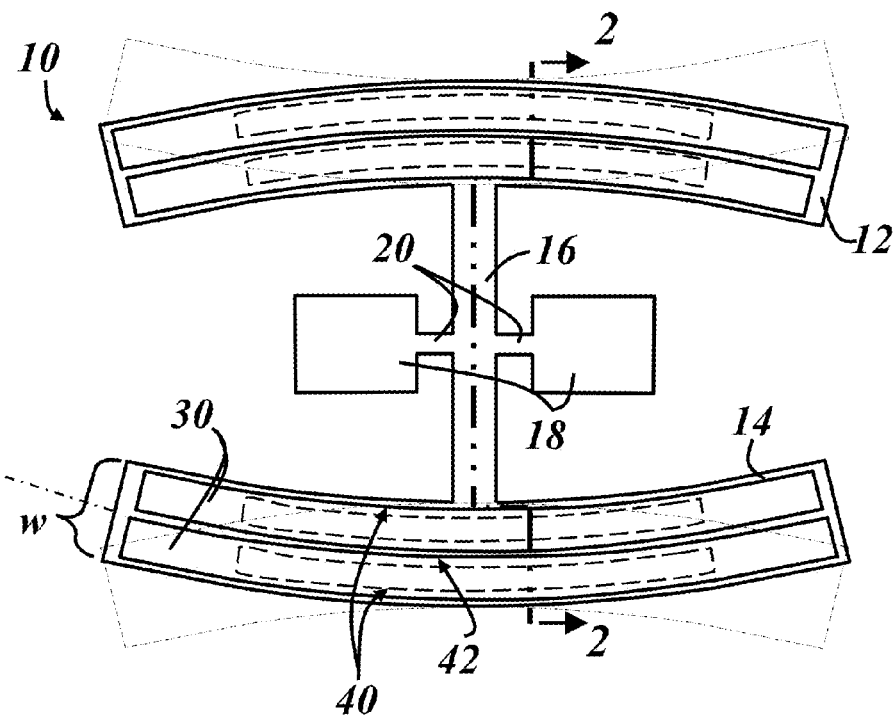
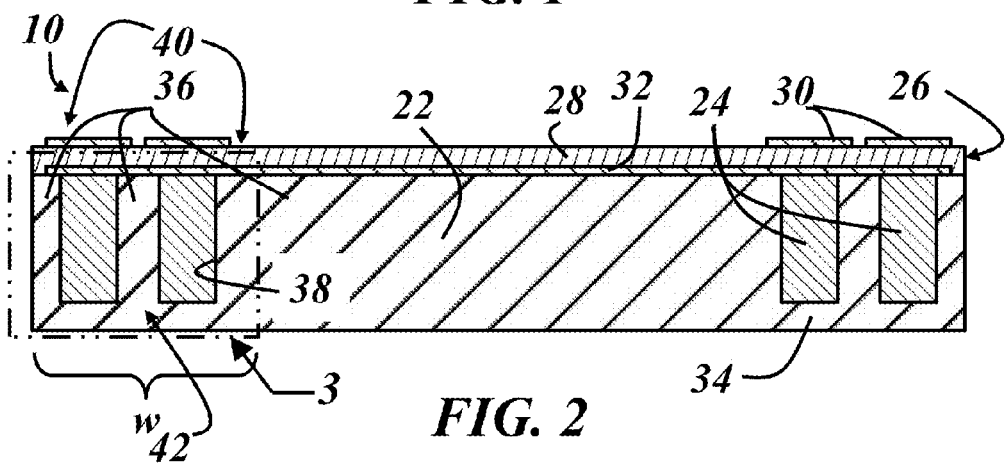
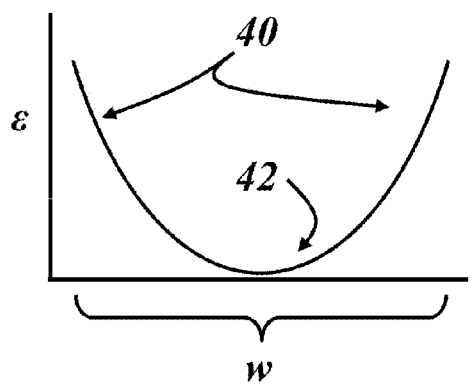
FIG. 1
FIG. 2
FIG. 3

METHOD OF MANUFACTURING A TEMPERATURE-COMPENSATED MICROMECHANICAL RESONATOR

CROSS-REFERENCE TO RELATED APPLICATION

This application claims the benefit of U.S. Provisional Patent Application No. 61/553,907 filed Oct. 31, 2011, the entire contents of which are hereby incorporated by reference.

TECHNICAL FIELD

This invention relates to micromechanical or micro-electromechanical resonators in general and to such resonators used as clocks for timing and inertial measurement and other applications.

BACKGROUND

Micro-electromechanical (MEMS) resonator devices have been developed as potential replacements for traditional quartz-based oscillators to provide a time reference frame in electronics applications. However, many of the materials suitable for use in MEMS applications have temperature-sensitive resonance properties, such as high temperature coefficients of elasticity (TCE). Resonators formed from materials with a high TCE have high temperature coefficients of frequency (TCF). Various methods and structures have been proposed for decreasing the TCF of such resonators, including passive compensation techniques and active compensation techniques, the latter typically increasing the energy consumption in some form.

SUMMARY

In accordance with one embodiment, there is provided a micro-electromechanical (MEMS) device including a resonator body formed from a material that has a temperature coefficient of elasticity (TCE) that is one of positive or negative. The device further includes a capping layer overlying and coupled with the resonator body, along with one or more passive temperature compensating elements. Each compensating element is encapsulated in the device between the resonator body material and the capping layer, and each compensating element is formed from a material having a TCE that is the other one of positive or negative.

In accordance with another embodiment, there is provided a method of making a temperature compensated resonator for use in a MEMS device. The method comprises the steps of: (a) providing a substrate including a device layer; (b) replacing material from the device layer with material having an opposite temperature coefficient of elasticity along a pre-determined region of high strain energy density for the resonator; (c) depositing a capping layer over the replacement material; and (d) etch-releasing the resonator from the substrate.

In accordance with another embodiment, there is provided a MEMS device including a monolithic resonator body formed from a material that has a TCE that is one of positive or negative. The resonator body has one or more trenches formed only partially through the material thickness, and each trench is at least partially filled with a temperature compensating material having a TCE that is the other one of positive or negative. The device further includes a transducer overlying the filled trenches and coupled with the resonator body.

DESCRIPTION OF THE DRAWINGS

One or more illustrative embodiments of the invention will hereinafter be described in conjunction with the appended drawings, wherein like designations denote like elements, and wherein:

FIG. 1 is a schematic top view of an embodiment of a temperature compensated MEMS resonator;

FIG. 2 is a cross-sectional view of the resonator of FIG. 1;

FIG. 3 is a plot of the strain distribution across the width of a flange of the resonator of FIG. 1;

DESCRIPTION OF THE ILLUSTRATED EMBODIMENTS

Figure 4:
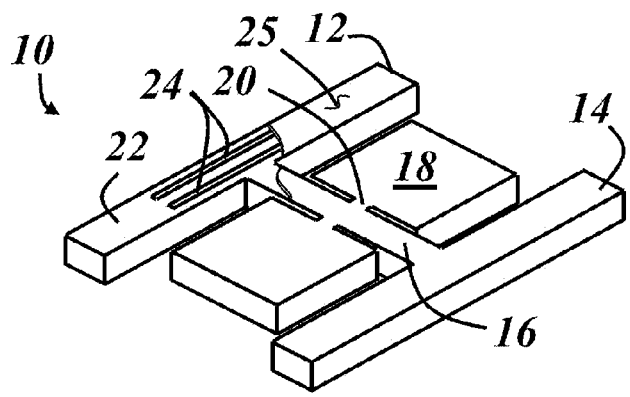
FIG. 4 is cutaway view of an embodiment of a resonator having a MI-BAR configuration.

Described and shown herein are embodiments of a micromechanical resonator that is passively compensated to reduce the temperature coefficient of frequency (TCF). Materials commonly used for resonator microfabrication may become stiffer at higher temperature resulting in positive TCF values (e.g., silicon dioxide) or stiffer at lower temperatures resulting in negative TCF values (e.g., silicon). The disclosed resonator may be part of a MEMS device and includes temperature compensating material encapsulated within the resonator between a resonator body and a capping layer. The compensating material has a TCE that is opposite to that of the resonator body material—i.e., one material has a positive TCE and the other has a negative TCE. The compensating material can be located at or near high strain energy density regions of the resonator to help minimize the total amount of compensating material necessary to bring the overall TCF of the resonator close to zero. The compensating material may also be located in trenches formed only partially through the resonator body material, thus allowing the microfabricated resonator to be released from the remaining substrate using wet-etch release methods without etching away any of the compensating material.

FIG. 1 is a top schematic view of an illustrative resonator 10. The resonator 10 of FIG. 1 is a modified I-BAR or MI-BAR type resonator including a pair of resonator flanges 12, 14 at opposite ends of a connector rod 16. The connector rod 16 is coupled with anchors 18 via thin tethers 20. In use, the anchors 18 may be fixed to some underlying structure with the remainder of the resonator 10 free to move relative to the anchors. In this example, the resonator flanges 12, 14 are the main resonating portions of the resonator configured to oscillate at a desired frequency when excited by a suitable transducer, though the connector rod 16 and tethers 20 may oscillate some small amount as well, only at a much lower magnitude. In FIG. 1, the resonating flanges 12, 14 are depicted in a first deflected state, and each flange oscillates between this first deflected state and a second deflected state shown in phantom. This is only one example of a microfabricated resonator, and other non-limiting examples are depicted in subsequent figures.

FIG. 2 is a cross-sectional view of the resonator 10 of FIG. 1. It is noted that no particular significance is assigned to the cross-hatching or the illustrated layer thicknesses. These characteristics of the figures are included for clarity. The resonator 10 includes a resonator body 22, one or more passive temperature compensating elements 24, and a transducer 26 coupled with the resonator body 22. In this example, the transducer 26 includes a piezoelectric layer 28 between top and bottom electrodes 30, 32 and overlies the compensating elements 24 and the resonator body. In other embodiments, the transducer 26 may be piezoresistive, capacitive, magnetic, electrostatic, thermal, or any combination thereof. The transducer 26 may also be separate from the resonator body 22 and the coupling does not necessarily include physical contact. In the illustrated embodiment, the transducer 26 is also a capping layer. In particular, the bottom electrode 32 is the capping layer in FIG. 2, but the capping layer can include portions of more than one layer of the transducer 26, the capping layer can be one or more additional layers between the compensating elements 24 and the transducer, or the capping layer can be one or more layers of material overlying the compensating elements in the absence of a transducer.

The resonator body 22 is formed from a material that has a TCE that is either positive or negative, and the compensating elements 24 are formed from a material having a TCE that is opposite that of the resonator body material. One example of a suitable material pairing includes silicon as the resonator body material and an oxide of silicon as the compensating element material. Another example includes silica as the resonator body material and polysilicon and/or a metal as the compensating element material. Each compensating element 24 is encapsulated in the resonator between the resonator body 22 and the capping layer, which in this case is provided by the transducer 26. Each compensating element 24 is in contact with the transducer 26 or some other capping layer on one side (the top side in FIG. 2) and in contact with resonator body material on every other side (bottom and sides in FIG. 2).

In one embodiment, the resonator body 22 is monolithic, meaning that it is formed from a single piece of material with no assembly joints. The monolithic structure has a base 34 with a plurality of standing features 36 extending away from the base 34. These standing features 36 may be in the form of walls, ribs, bosses, protrusions, etc. In the example of FIG. 2, the standing features 36 partly define trenches 38. In the illustrated embodiment, the trenches 38 are formed only partially through the thickness of the resonator body material, and the temperature compensating elements 24 are located in the trenches so that temperature compensating material at least partially fills each trench and preferably substantially fills each trench.

The temperature compensating material is present in the resonator 10 in an amount that brings the TCF of the resonator closer to zero than it would be without the temperature compensating elements 24. This amount can vary depending on the location of the compensating elements 24. Locating the compensating elements 24 at a high strain energy density region of the resonator 10 can enhance the compensating effect of the elements. The resonator 10 of FIGS. 1 and 2 includes high strain energy density regions 40 along lengthwise edges of the resonating flanges 12, 14 as shown. FIG. 3 shows the strain distribution during operation across the width w of one of the resonating flanges, with maximum values along the lengthwise edges of the flanges and minimum values along the lengthwise center or longitudinal axis of the flanges. The strain distribution is approximately parabolic in this example. The centers of the flanges in this case represent low strain energy density regions 42. Other low strain energy density regions of the resonator 10 include the connector rod, anchors, and tethers 16-20. Thus, locating the temperature compensating elements 24 as close as possible to the lengthwise edges of the flanges 12, 14 in this case can help minimize the amount of temperature compensating material necessary to bring the resonator TCF closer to zero. Less temperature compensating material also means that less resonator body material must be removed to make room for the compensating material, potentially contributing to higher quality factor (Q) for the compensated resonator.

FIGS. 4-7 illustrate other non-limiting resonator configurations that may be temperature compensated as described herein. FIG. 4 is a cutaway view of a MI-BAR resonator 10 similar to that of FIGS. 1 and 2. In this example, the transducer is omitted and the resonator is additionally coated with a material, which may be the same as that used in the temperature compensating elements 24. For example, a silica resonator body 22 may include compensating elements 24 and an outer coating 25 comprising polysilicon.

Figure 5:
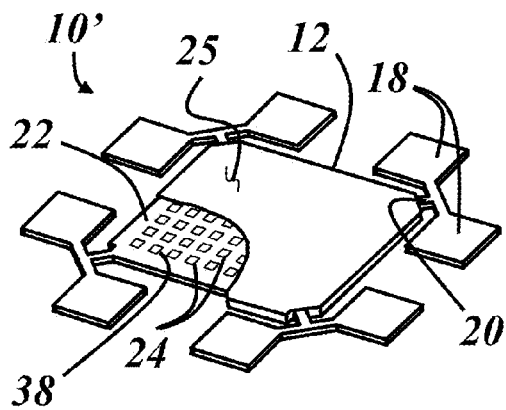
FIG. 5 is a cutaway view of an embodiment of a resonator having a lame-mode configuration.
Figure 6:
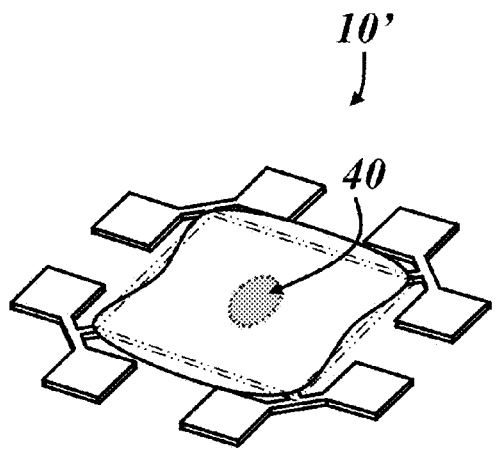
FIG. 6 is a depiction of a strain field simulation applied to the resonator of FIG. 5, showing high and low strain energy density regions.

FIG. 5 is a cutaway view of a lame-mode resonator 10', and FIG. 6 is a depiction of the strain field along the resonator. The shaded area at the center represents a high strain energy density region 40. In the example of FIG. 5, the temperature compensating elements 24 are uniformly distributed across the resonating portion 12 of the resonator body 22, and the trenches 38 have a low aspect ratio near 1.0. The lame-mode resonator 10' may provide good power handling with capacitive transduction. In a different embodiment, elements 24 are located only along the center of the resonator and are not located near the edges of the resonator.

Figure 7:
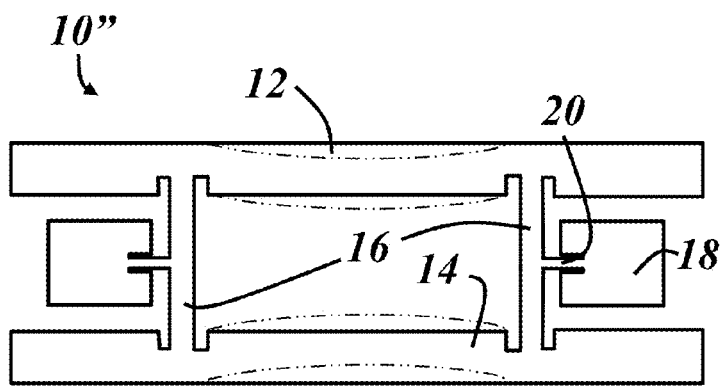
FIG. 7 is a top view of another embodiment of a resonator having a different MI-BAR configuration.

FIG. 7 is a top view of a different type of MI-BAR resonator 10" in which the above-described temperature compensation may be employed. The resonator 10" includes capacitively-transduced fused silica bars 12, 14 as the main resonating portions of the resonator, operated in a flexural mode. This design offers a high Q, a low motional impedance, and a wide tuning range via spring softening (active compensation). The resonator 10" operates in a hybrid mode with both flexure and length extension contributing to the resonator performance. The resonator 10" includes two connector rods 16 tethered to two central anchors 18, which are mechanically anchored to the substrate. It may be etched out of the full thickness of a silica wafer using deep reactive ion etching (DRIE), which gives a large area for the transduction electrodes. Temperature compensation trenches can be formed during the same DRIE step. The process can utilize conformal polysilicon coatings to both reduce the transduction gap, which provides low motional impedance, and to reduce the overall TCF. The resonator is shown in a relaxed state, with a first deflected state shown in phantom.

Figure 8:
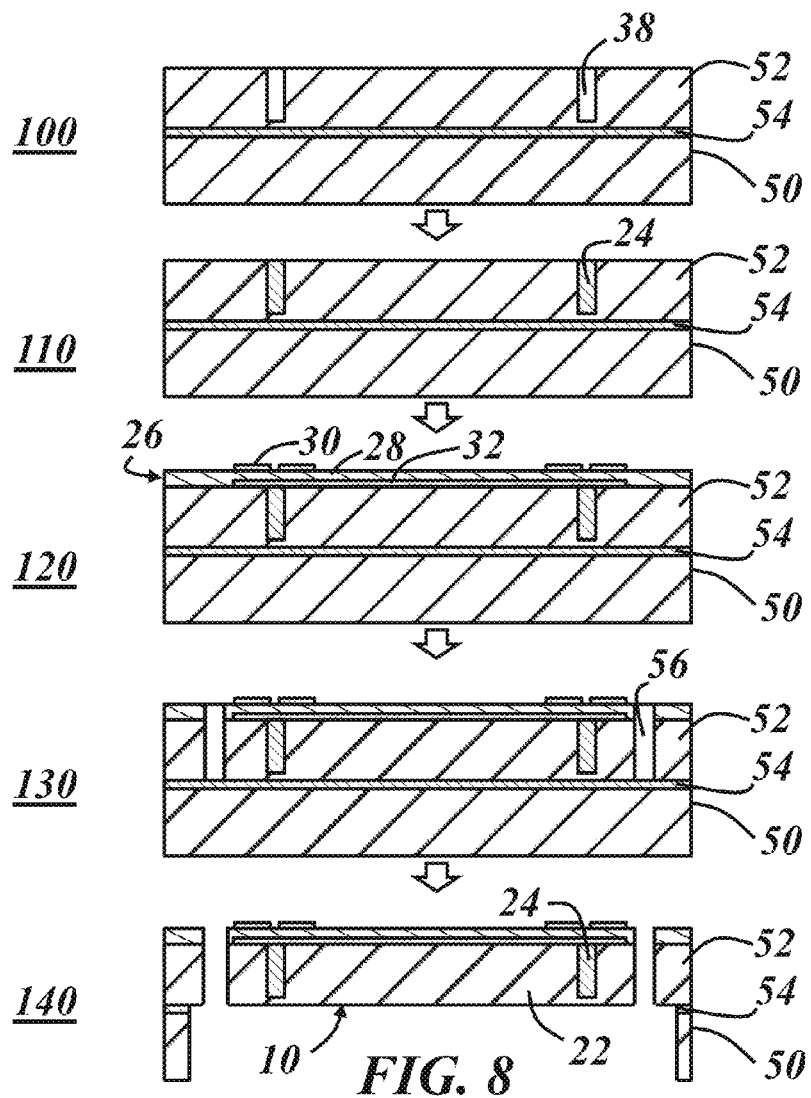
FIG. 8 is a schematic depiction of an embodiment of a method of making a temperature compensated resonator.

Referring now to FIG. 8, there is shown an exemplary method of making a temperature compensated resonator for use in a MEMS device. The method generally includes providing a substrate 50 including a device layer 52. The material of the device layer 52 is the resonator body material described above. The illustrated substrate includes a buried release layer 54, such as an oxide layer, but this layer is optional. For example, the substrate 50 may be a silicon on insulator substrate (SOI) and the resonator body 22 may be made from the silicon device layer 52. Next, some of the material from the device layer 52 is replaced with a material having an opposite TCE, thereby forming the above-described temperature compensating elements 24. This material replacement may be performed along a pre-determined region 40 of high strain energy density for the resonator as described above.

In the illustrated embodiment, material replacement occurs in two separate steps, labeled 100 and 110 in FIG. 8. In step 100, trenches 38 are formed only partially through the device layer 52, and in step 110, the replacement material is disposed along and within the formed trenches. The replacement material may be deposited or grown (e.g. a thermal oxide) or both to fill the trenches 38 and form the temperature compensating elements 24. A further LPCVD or PECVD process may be used to completely fill the trenches 38 and close any possible void. Excess replacement material may be removed from the top surface of the device layer 52 before additional layers are deposited.

In illustrated step 120, a capping layer, in the form of piezoelectric transducer 26, is deposited over the device layer 52 as shown. The bottom electrode layer 32 may be molybdenum (Mo) or any other suitable conductive material, the piezoelectric layer 28 may be aluminum nitride (AlN) or any other suitable piezoelectric material, and the top electrode layer 30 may include gold (Au) and/or chromium (Cr) or any other suitable conductive material. In a different embodiment, the capping layer is a polysilicon layer.

A boundary trench 56 is formed in step 130 of the embodiment of FIG. 8. The boundary trench 56 generally defines the outer shape or contour of the resonator. The boundary trench 56 is formed deeper or further into the device layer 52 than the other trenches 38 so that some thickness of device layer material remains beneath the formed trenches 38 to protect the temperature compensating elements 24 during a subsequent release step. In the embodiment of FIG. 8, the boundary trench is formed completely through the thickness of the device layer 52 to the buried release layer 54, while the compensation trenches 38 are formed so that they stop short of the release layer, leaving some of the device layer material at the bottom.

Figure 9:
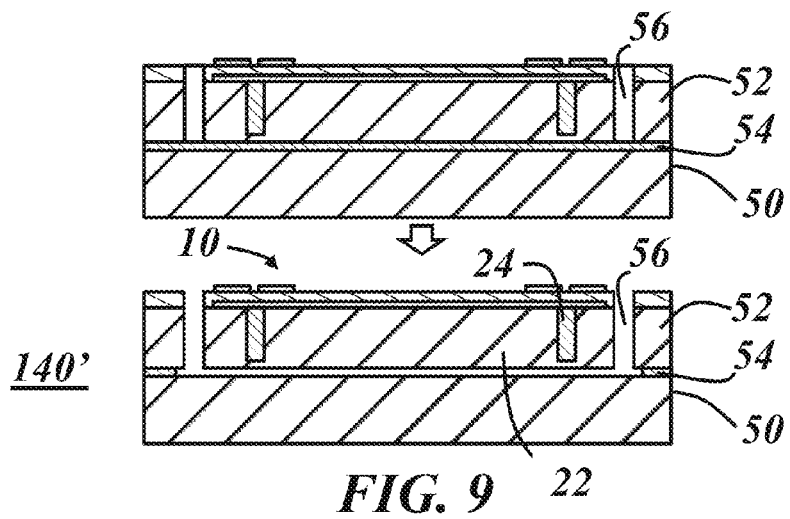
FIG. 9 is a schematic depiction of an alternative wet-release step that may be used with the method of FIG. 8.

In step 140, the resonator 10 is released from the substrate. In the embodiment of FIG. 8, the release step is performed from the back or bottom side of the substrate by DRIE and/or RIE. However, the above-described method, where the trenches 38 are formed only partially through the thickness of the device layer, lends itself to a wet-etch release process in which a fluid etchant can enter the boundary trench 56 to etch away the buried release layer 54 without harming or etching away any of the temperature compensating elements 24—which in some cases may be have a similar material composition with the substrate release layer 54 (e.g., an oxide of silicon). This alternative release step 140' is shown in FIG. 9.

Figure 10:
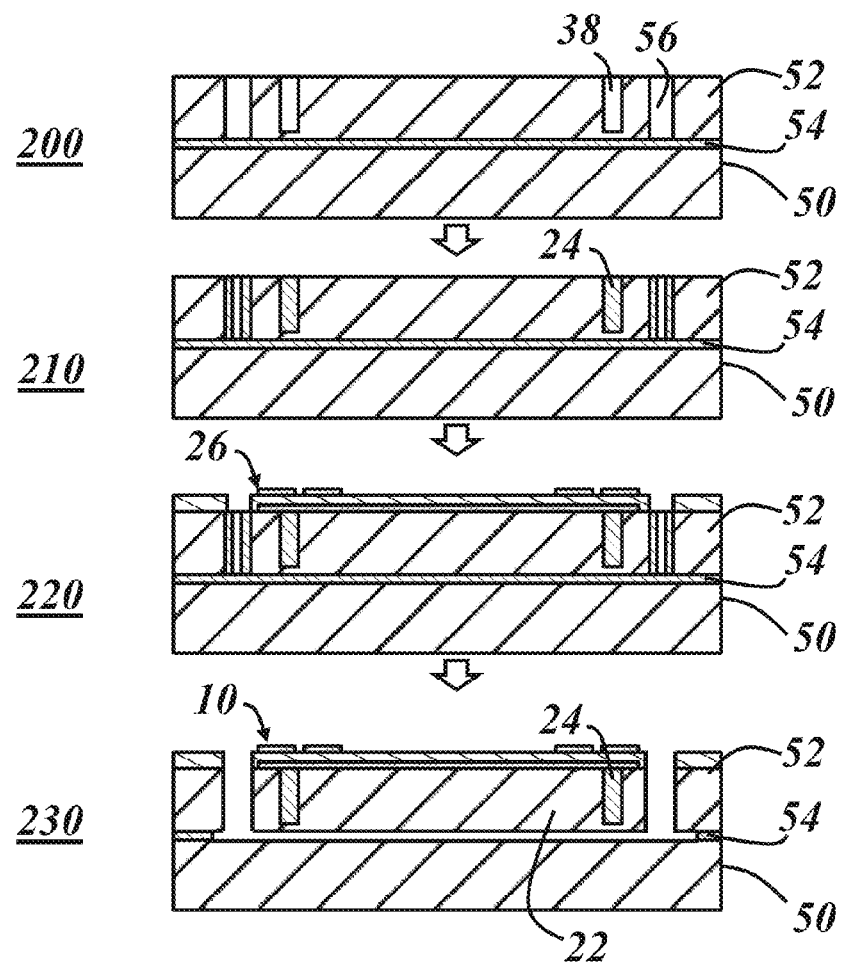
FIG. 10 is a schematic depiction of another embodiment of a method of making a temperature compensated resonator, where compensation trenches and a boundary trench are formed simultaneously at different etch rates.

In a different embodiment, the boundary trench 56 is formed simultaneously with the compensation trenches 38, as illustrated in FIG. 10. In this embodiment, a DRIE process may be used to form the boundary trench 56 and the other trenches 38 simultaneously, as shown in step 200. The boundary trench 56 is made wider than the other trenches 38, and a DRIE-lag phenomenon causes the wider boundary trench to be formed at faster rate—i.e. a wider trench is formed deeper when the trenches are all formed together. In this embodiment, the boundary trench 56 is formed completely through the device layer 52 to the buried layer 54. In step 210, where the replacement material is disposed along the trenches 38, it may also be disposed along the boundary trench 56 as shown. Where a thermal oxide approach is employed, the wider boundary trench 56 may not completely fill with the oxide by the time the compensation trenches 38 are filled. The process then proceed similar to the process of FIG. 8, with a transducer 26 or other capping layer being patterned and deposited over the filled trenches, but not over the boundary trench 56, in step 220. The resonator 10 can then be wet-released via fluid etching as shown in step 230. This technique offers improved registration of the boundary or outer contour of the resonator 10 with respect to the temperature compensating elements 24, because the mask openings for the boundary trench and the compensation trenches can all be included in a single DRIE mask. The finished outer contour of the resonator may be smoother as well, as oxidation and subsequent wet-release processes are capable of producing smoother surfaces than DRIE, for example.

Figure 11:
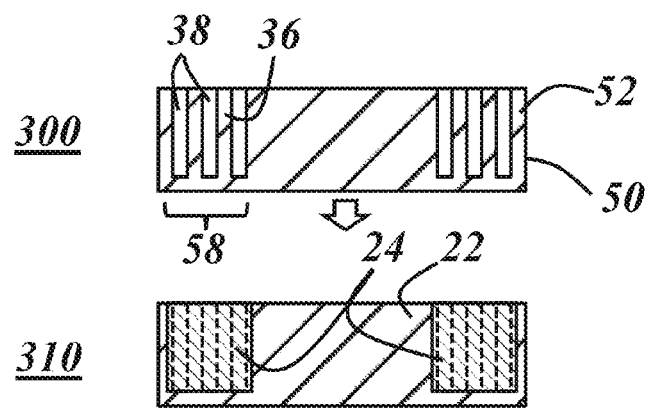
FIG. 11 is a schematic depiction of the initial steps of another embodiment of a method of making a temperature compensated resonator.

In another embodiment, shown in FIG. 11, the initial trench forming and filling steps are modified with respect to the embodiment of FIG. 8. In step 300, two or more trenches 38 are formed in the device layer 52 sufficiently close to each other so that, where an oxide growth process is employed in step 310 to produce the replacement material, the oxide extends from one trench location to the other. In other words, the wall 36 between adjacent trenches 38 is consumed by the oxidation process to an extent where oxide replaces the wall. The result is a temperature compensating element 24 that is at least as wide as a trench region 58 that includes all of the sufficiently close trenches.

Figure 12:
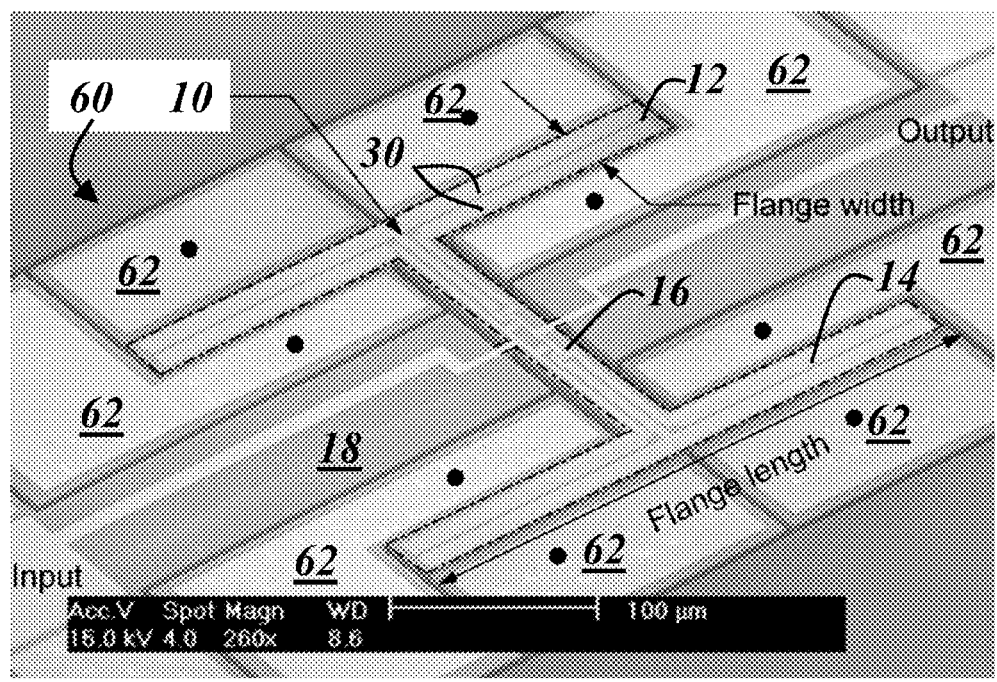
FIG. 12 is an SEM photograph of a MEMS device fabricated according to one embodiment.
Figure 13:
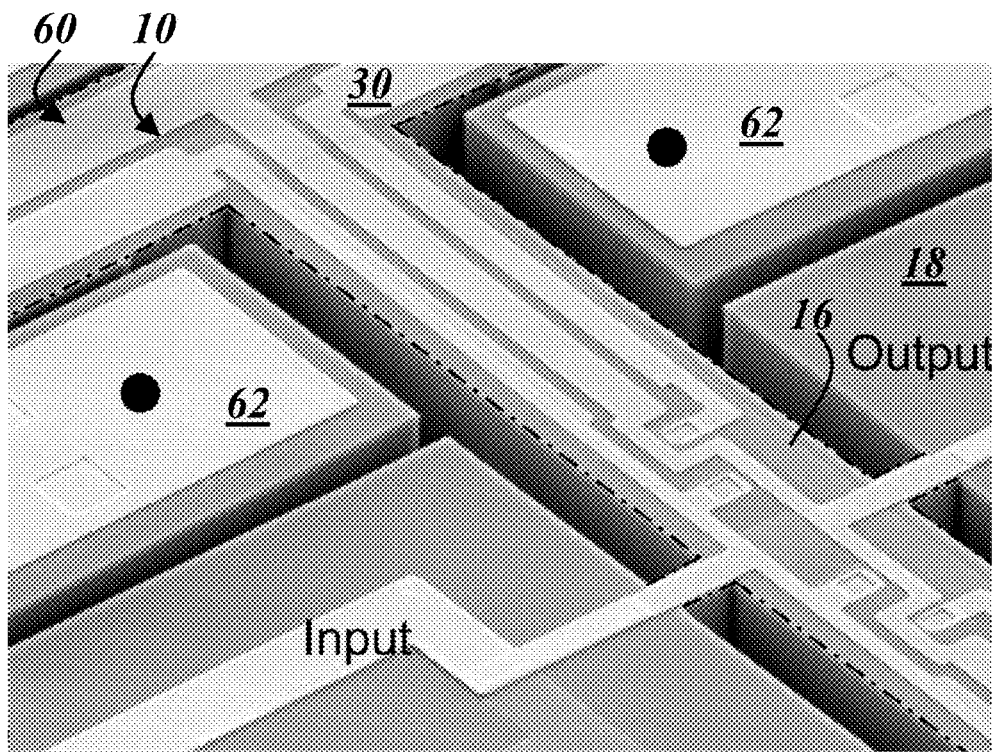
FIG. 13 is an enlarged view of a portion of FIG. 12.

FIGS. 12 and 13 are SEM images of a MEMS device 60 constructed according to the structures and methods described above. Device 60 includes a piezoelectric-transduced, temperature-compensated MI-BAR resonator 10. The resonating flanges 12 and 14, connector rod 16, anchors 18, tethers 20, and the top electrode layer 30 are all shown in the figures. The MEMS device 60 also includes one or more active temperature compensation devices, including eight tuning electrodes 62 arranged about the outer edges of the resonator 10.

Figure 14:
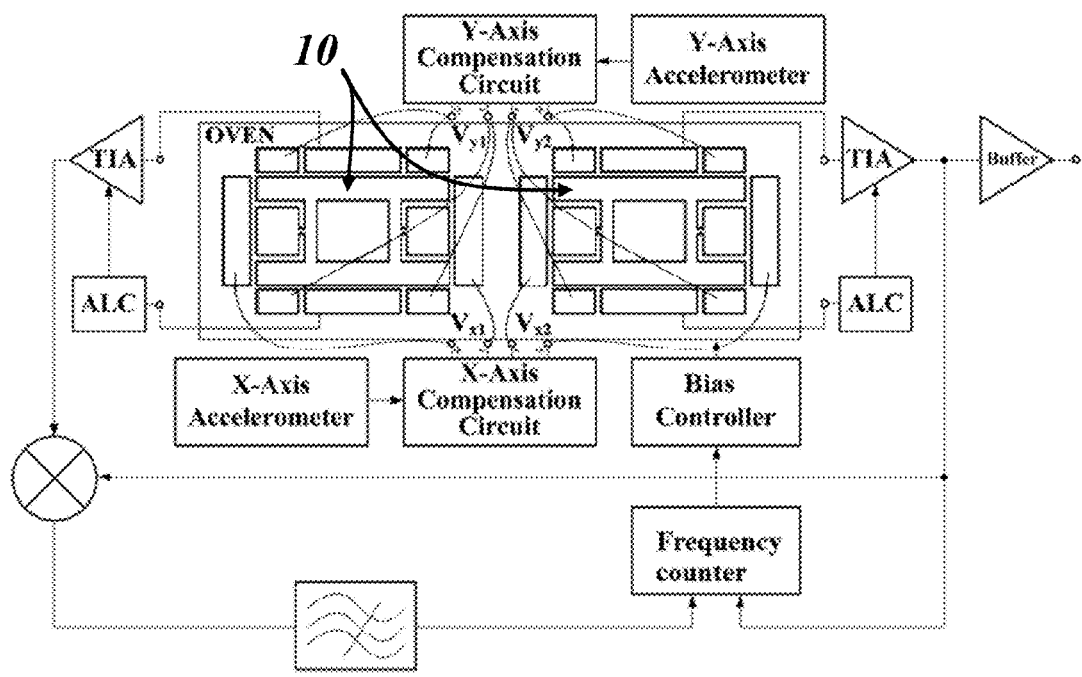
FIG. 14 is a schematic view of a compensation system for use with the resonators described herein.

To compensate for non-stationary noise, a compensation system architecture such as that shown in FIG. 14 may be used. Temperatures of two resonators 10 having similar center frequency but dissimilar TCF values (e.g. one compensated and one uncompensated resonator) are compared in a close-loop feedback control form. The loop senses the frequency of the uncompensated resonator to estimate the temperature change and uses active compensation to servo the frequency of the compensated resonator to the original value via a bias voltage.

For shock or vibration compensation, open-loop control with incorporated accelerometers may be utilized. Compared to the conventional technique which can only compensate a single directional acceleration, the disclosed embodiments can compensate both x and y-axis acceleration. Based on acceleration or vibration sensing, DC bias from the X-Axis and Y-Axis Compensation Circuits are provided to the additional electrodes to provide this compensation. These compensation electrodes can be also utilized to compensate short-term instability, any residual temperature sensitivity, or frequency drift due to aging or stress relief.

Device Fabrication

The devices illustrated in FIGS. 12 and 13 were constructed in accordance with the above disclosure and as follows. The starting substrate was a 100 mm SOI wafer with a 20 μm thick high resistivity (>1000 Ω·cm) device layer. First, the temperature compensation trenches were etched using deep reactive ion etching (DRIE). These trenches were subsequently refilled by growing 1.4 μm of thermal silicon dioxide at 1200° C. The trench depth was kept slightly less than the device layer thickness to ensure that silicon was separating the buried oxide layer from the oxide-refilled trenches. Post-oxidation, the wafer surface was polished to a smooth and flat finish using chemical mechanical polishing (CMP) to ensure a smooth surface for the subsequent reactive sputtering of high quality AlN with low stress and vertical c-axis orientation.

After CMP, a 100 nm thick layer of molybdenum (Mo) was deposited as the bottom electrode. The Mo layer was patterned to reduce eddy currents during AlN sputtering which enables better control of the AlN film stress. A 0.5 μm thick low-stress AlN transduction layer was subsequently deposited in a Tegal AMS SMT reactive sputtering system. A 100 nm thick gold (Au) layer was evaporated and lift-off patterned as the top metal. A thin chrome (Cr) layer (10 nm) was used to improve adhesion between the gold and the AlN. The gap between the resonator and the tuning electrodes was defined by etching the AlN and the silicon device layer using DRIE. Finally, the device was released by selective backside removal of silicon and the buried oxide layer.

In order to demonstrate the applicability of this temperature compensation structure with wet release, proof-of-concept devices have been fabricated. In this case, after the trench refill process, a 2 μm thick polysilicon layer was deposited and subsequently polished in order to protect the oxide-refilled trenches during wet release. The rest of the process remained the same as noted above with the DRIE release technique. In the final step, the devices were released using a 1:1 49% HF:DI water solution. Native oxide on the polysilicon surface was removed with a short HF dip before bottom electrode deposition to prevent Mo lift-off during the release.

Figure 15:
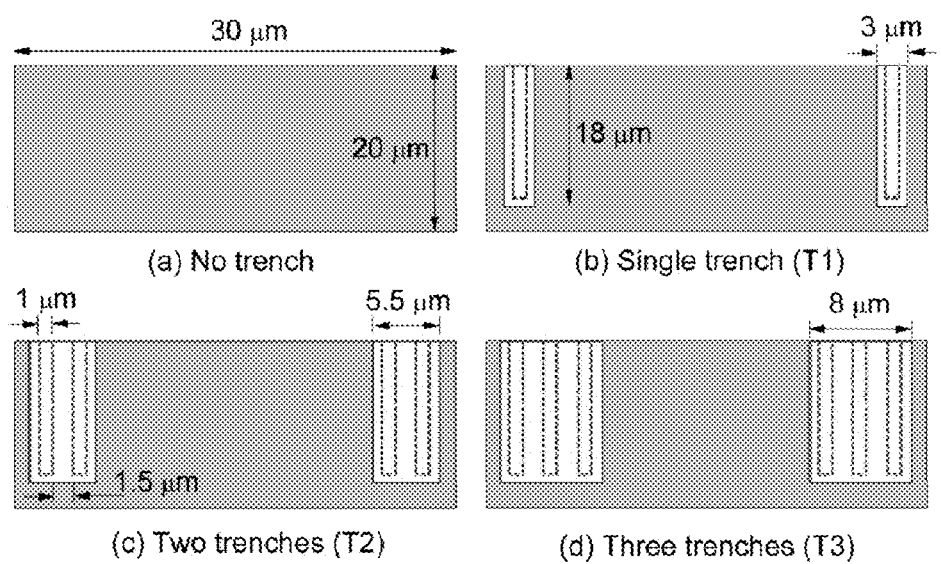
FIG. 15 illustrates experimental trench configurations used to evaluate resonators fabricated as described herein.

FIG. 15 shows different trench configurations used to evaluate resonators constructed as described above. Four different trench configurations were studied, with zero to three trenches per beam flange edge. All trenches had the same dimensions and are shown with dotted lines. The spacing between any two etched trenches was kept as 1.5 μm (as marked) in order to ensure that the trenches were fully refilled with thermal oxide.

Figure 16:
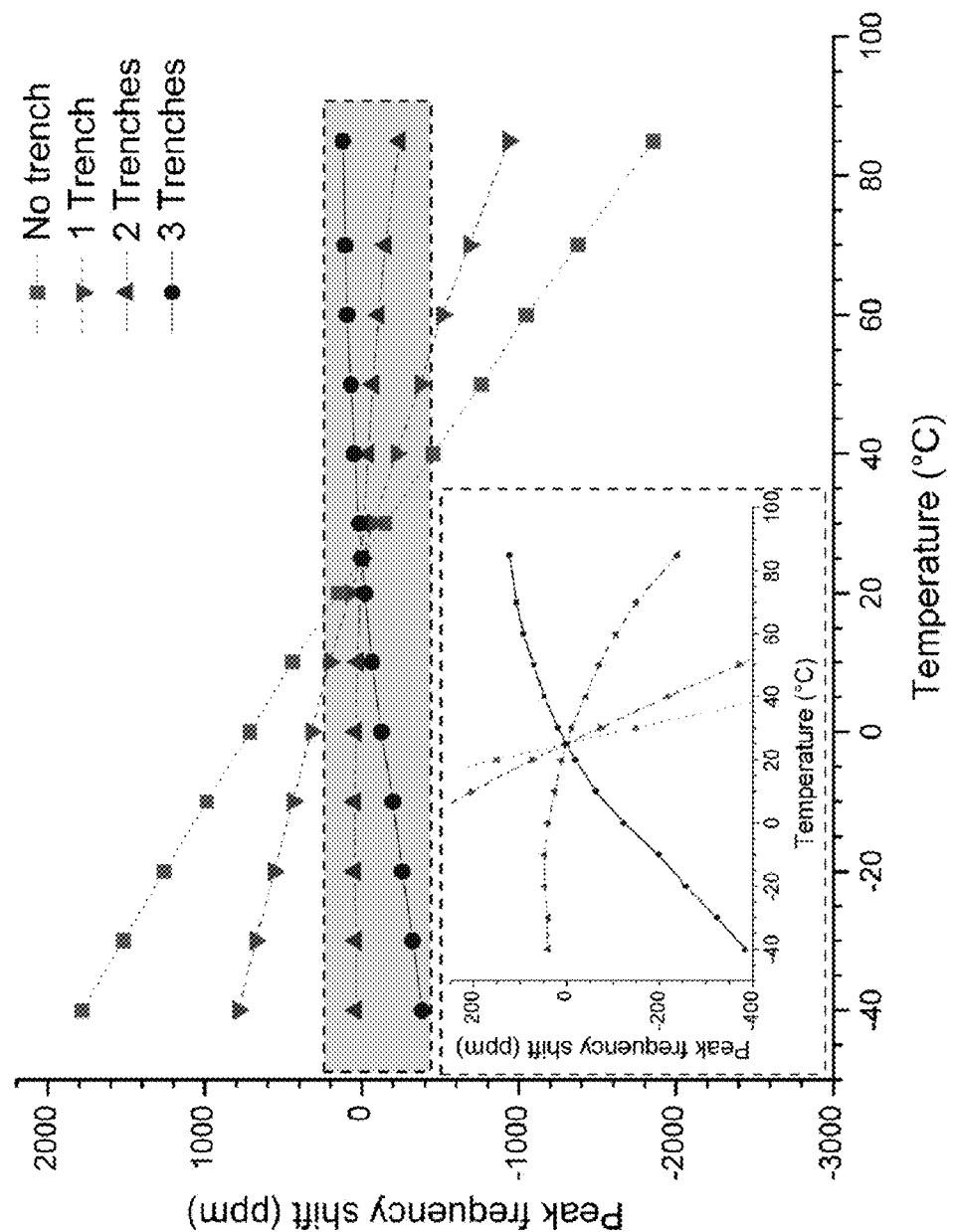
FIG. 16 is a plot of the peak frequency shift in ppm versus temperature for the four devices of FIG. 15.

In order to characterize the temperature dependence of resonance frequency, the devices were measured in a Lakeshore cryogenic probe station. Backside released samples were used for this study due to their higher process yield in an academic clean room. The temperature stability of the devices was characterized between −40° C. and +85° C., and the comparative results are shown in FIG. 16. The measured results for each configuration compared well with simulated values. The relative frequency shift (in ppm) is plotted as a function of temperature in FIG. 16. The two- and three-trench configurations show the lowest variation (<500 ppm) over the temperature range of −40° C. to +85° C.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of making a temperature compensated resonator for use in a MEMS device, comprising the steps of:
   (a) providing a substrate including a device layer;
   (b) replacing material from the device layer with a replacement material along a predetermined region of high strain energy density for a resonating portion of the resonator, wherein one of the device layer material or the replacement material has a positive temperature coefficient of elasticity (TCE), and the other one of the device layer material or the replacement material has a negative TCE;
   (c) depositing a capping layer over the replacement material; and
   (d) etch-releasing the resonator from the substrate,
   wherein the resonating portion of the resonator is configured to oscillate at a desired frequency when excited by a transducer, and
   wherein the resonating portion of the resonator comprises both the device layer material and the replacement material, thereby imparting the resonator with a temperature coefficient of frequency (TCF) that is lower than the TCF of the resonator without the replacement material.

2. The method of claim 1, wherein step (b) comprises the steps of:
   forming one or more trenches only partially through the device layer; and
   disposing the replacement material along the one or more trenches.

3. The method of claim 2, further comprising the step of:
   forming a boundary trench to generally define an outer shape of the resonator simultaneously with the step of forming one or more trenches only partially through the device layer, wherein the boundary trench is deeper than the other trenches.

4. The method of claim 2, wherein the step of disposing the replacement material comprises the step of growing an oxide along the one or more trenches to at least partially fill the one or more trenches.

5. The method of claim 4, wherein the step of forming one or more trenches only partially through the device layer comprises forming two trenches sufficiently close to each other so that the oxide extends from one trench location to the other during the step of growing the oxide.

6. The method of claim 1, wherein the capping layer comprises one or more transducer layers.

7. The method of claim 1, further comprising the steps of:
depositing a first electrode layer over the device layer after step (b);
depositing a piezoelectric layer over the first electrode layer; and
depositing a second electrode layer over the piezoelectric layer to form a piezoelectric transducer.

8. The method of claim 1, wherein said replacement material comprises an oxide.

9. The method of claim 1, wherein one of the device layer material and the replacement material comprises an oxide of the other one of the device layer material and the replacement material.

10. The method of claim 1, wherein one of the device layer material and the replacement material comprises silicon and the other of the device layer material and the replacement material comprises silicon dioxide.

11. The method of claim 1, wherein at least one of the device layer material and the replacement material comprises polysilicon or metal.

12. The method of claim 1, wherein the resonator is configured to operate in a longitudinal or a transverse resonance mode.

13. The method of claim 1, wherein the resonator is configured to operate in a flexural mode.

14. The method of claim 1, wherein the replacement material is uniformly distributed along the resonating portion of the resonator.

15. The method of claim 1, the method further comprising the step of coupling the resonator with an active temperature compensation device.

16. A method of making a temperature compensated resonator for use in a MEMS device, comprising the steps of:
(a) providing a substrate including a device layer;
(b) replacing material from the device layer with a replacement material along a pre-determined region of high strain energy density for a resonating portion of the resonator, wherein one of the device layer material or the replacement material comprises an oxide of the other material;
(c) depositing a capping layer over the replacement material; and
(d) etch-releasing the resonator from the substrate,
wherein the resonating portion of the resonator is configured to oscillate at a desired frequency when excited by a transducer, and
wherein step (b) comprises forming a trench in the device layer and disposing said oxide along the trench.

17. The method of claim 16, wherein said oxide is silicon dioxide.

18. The method of claim 16, wherein at least one of the device layer material and the replacement material comprises polysilicon or metal.

19. The method of claim 16, wherein the capping layer comprises a transducer.

* * * * *